United States Patent [19]
Tomioka

[11] Patent Number: 5,810,963
[45] Date of Patent: Sep. 22, 1998

[54] PLASMA PROCESSING APPARATUS AND METHOD

[75] Inventor: Kazuhiro Tomioka, Tokyo, Japan

[73] Assignee: Kabushiki Kaisha Toshiba, Kawasaki, Japan

[21] Appl. No.: 722,464

[22] Filed: Sep. 27, 1996

[30] Foreign Application Priority Data

Sep. 28, 1995 [JP] Japan ..................................... 7-250409
Sep. 2, 1996 [JP] Japan ..................................... 8-232084

[51] Int. Cl.$^6$ ....................................................... G23F 1/02
[52] U.S. Cl. ............... 156/345; 204/298.03; 204/298.32; 216/61; 438/17
[58] Field of Search ................................ 156/627.1, 345; 216/61; 204/298.03, 298.32

[56] References Cited

U.S. PATENT DOCUMENTS

| | | | |
|---|---|---|---|
| 4,557,819 | 12/1985 | Meacham et al. | 204/298 |
| 4,990,859 | 2/1991 | Bouyer et al. | 324/649 |
| 5,169,407 | 12/1992 | Mase et al. | 29/25.01 |
| 5,314,603 | 5/1994 | Sugiyama et al. | 204/298.32 |

*Primary Examiner*—Bruce Breneman
*Assistant Examiner*—Thomas W. Weingart
*Attorney, Agent, or Firm*—Oblon, Spivak, McClelland, Maier & Neustadt, P.C.

[57] ABSTRACT

In a conductive plasma process chamber, a susceptor, which serves as an electrode and on which a target substrate is placed, is arranged. During a plasma process, the process chamber is supplied with a process gas while being exhausted, so that the chamber is kept at a constant vacuum pressure. A RF power of 13.56 MHz from an RF power supply is amplified and applied to the susceptor through a directional coupler and a matching circuit. A reflection wave of the RF power reflected by the susceptor is extracted by the directional coupler and is subjected to envelope wave detection by a wave detector, to generate a wave detection signal. The wave detection signal is compared with a reference voltage in a comparator, to determine presence or absence of an occurrence of abnormal discharge. When abnormal discharge occurs, the RF power is cut off for a predetermined period of time and the abnormal discharge is damped.

25 Claims, 9 Drawing Sheets

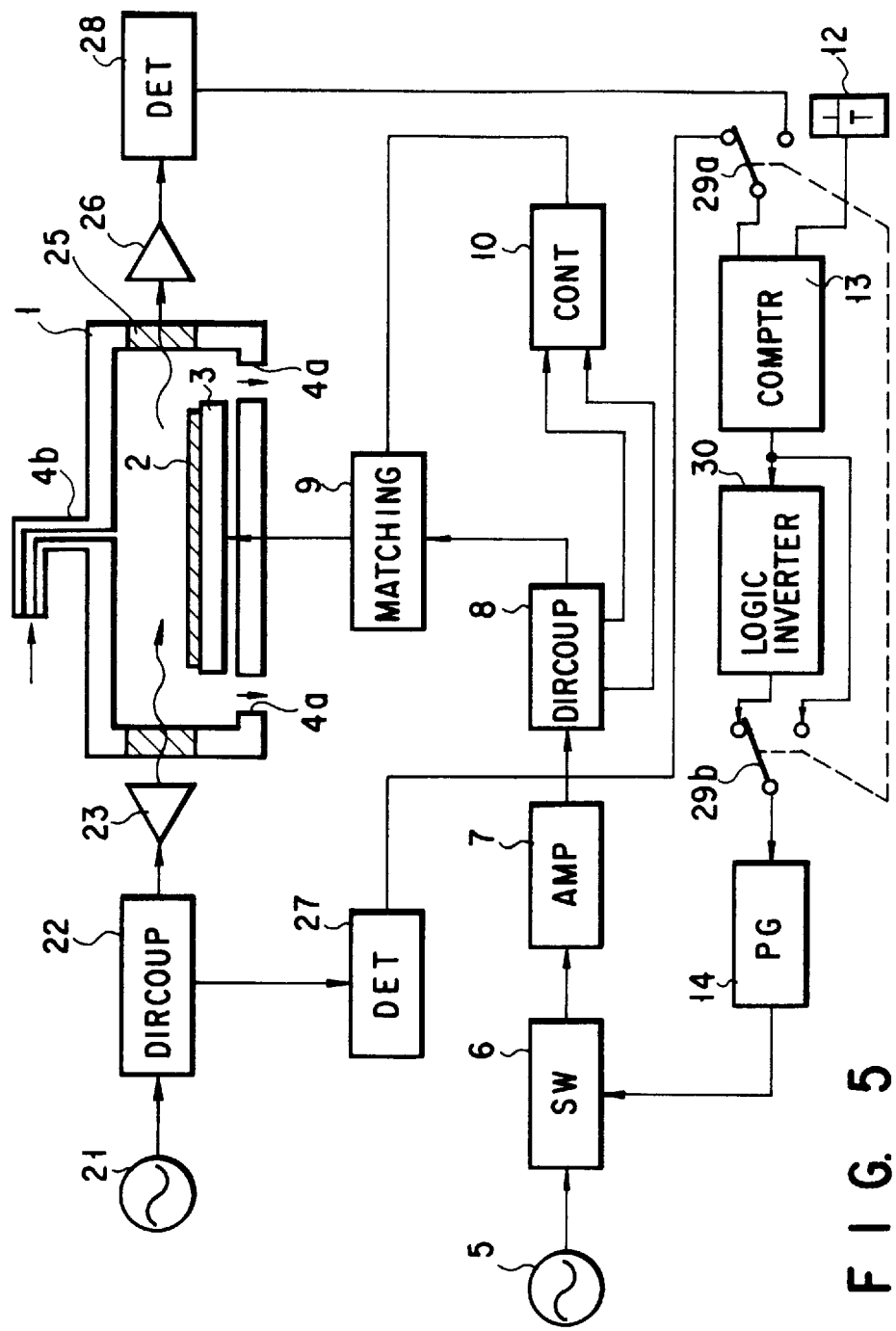
F I G. 5

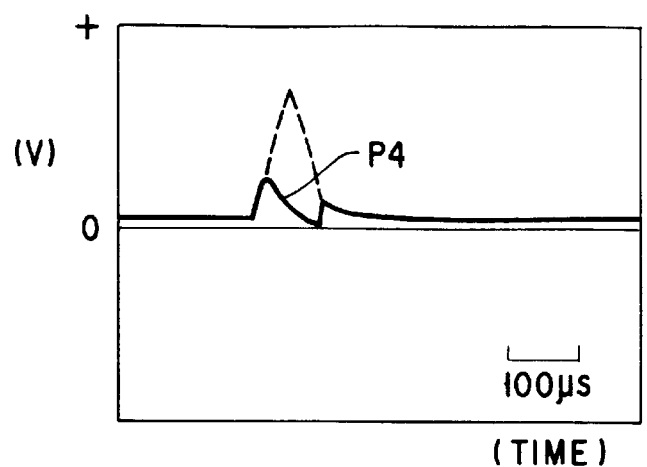
F I G. 6
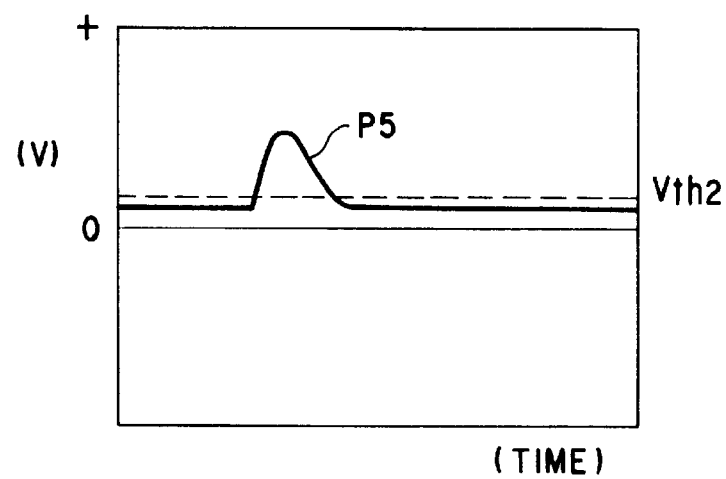
F I G. 7
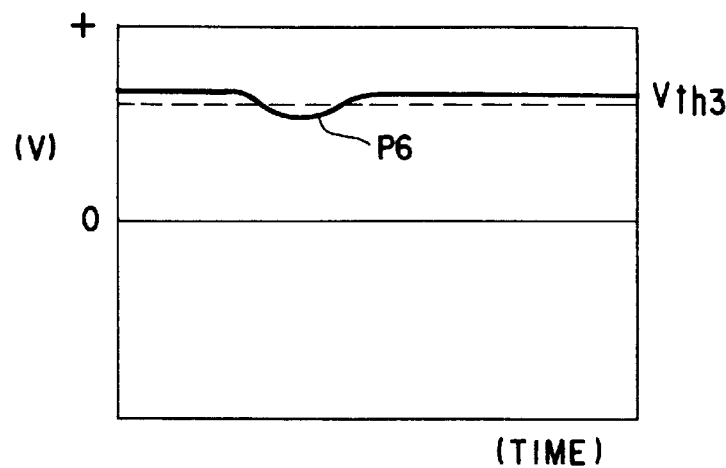
F I G. 8

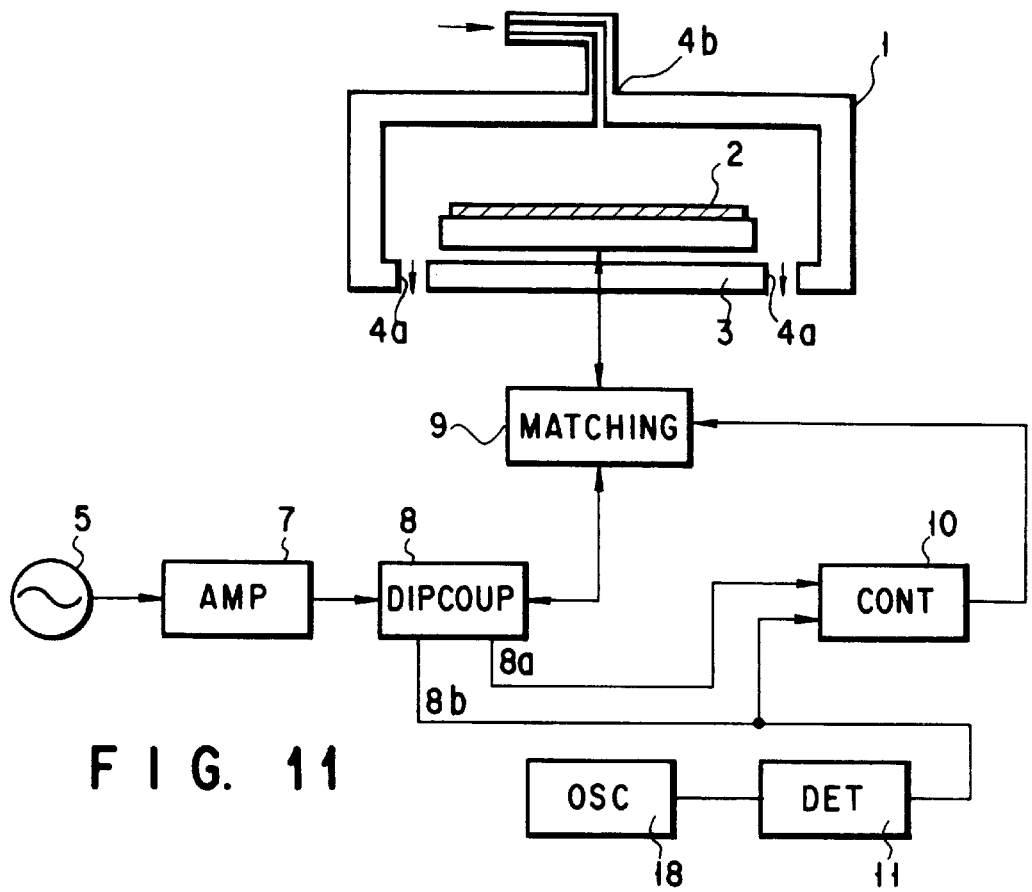
F I G. 11
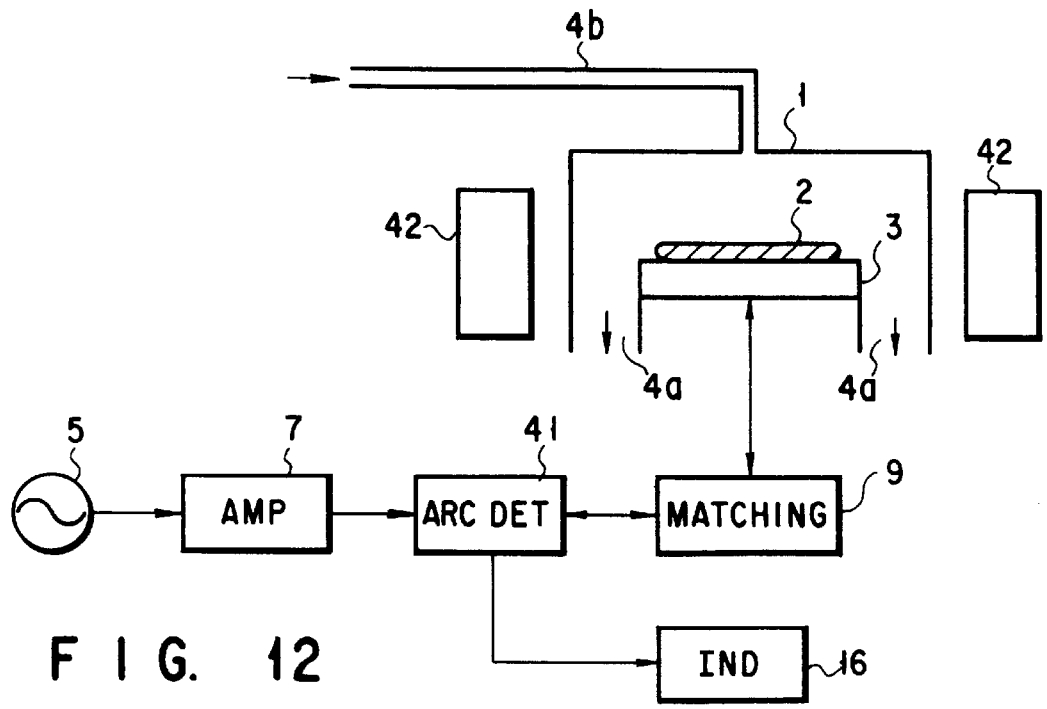
F I G. 12

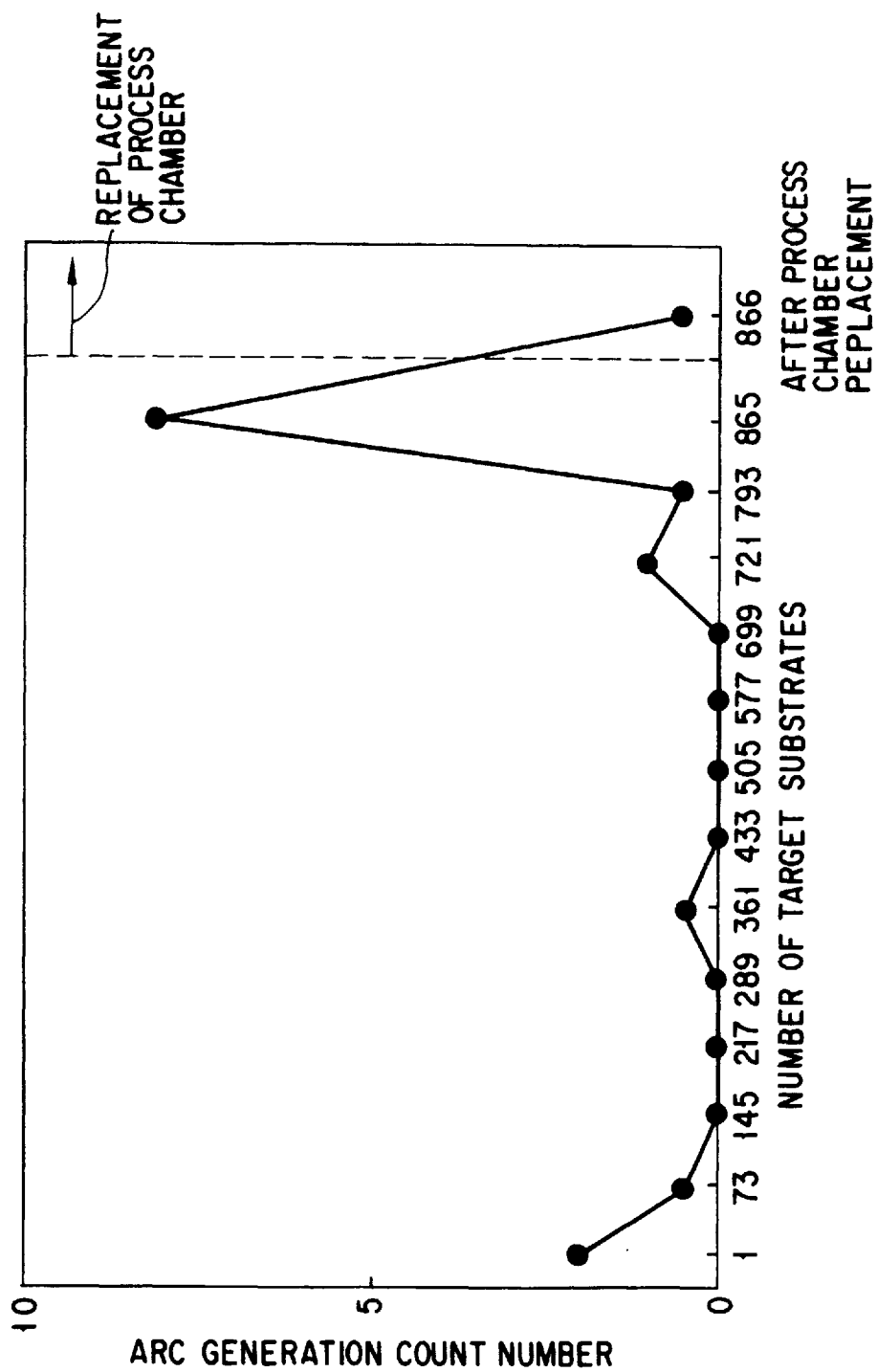
F I G. 13

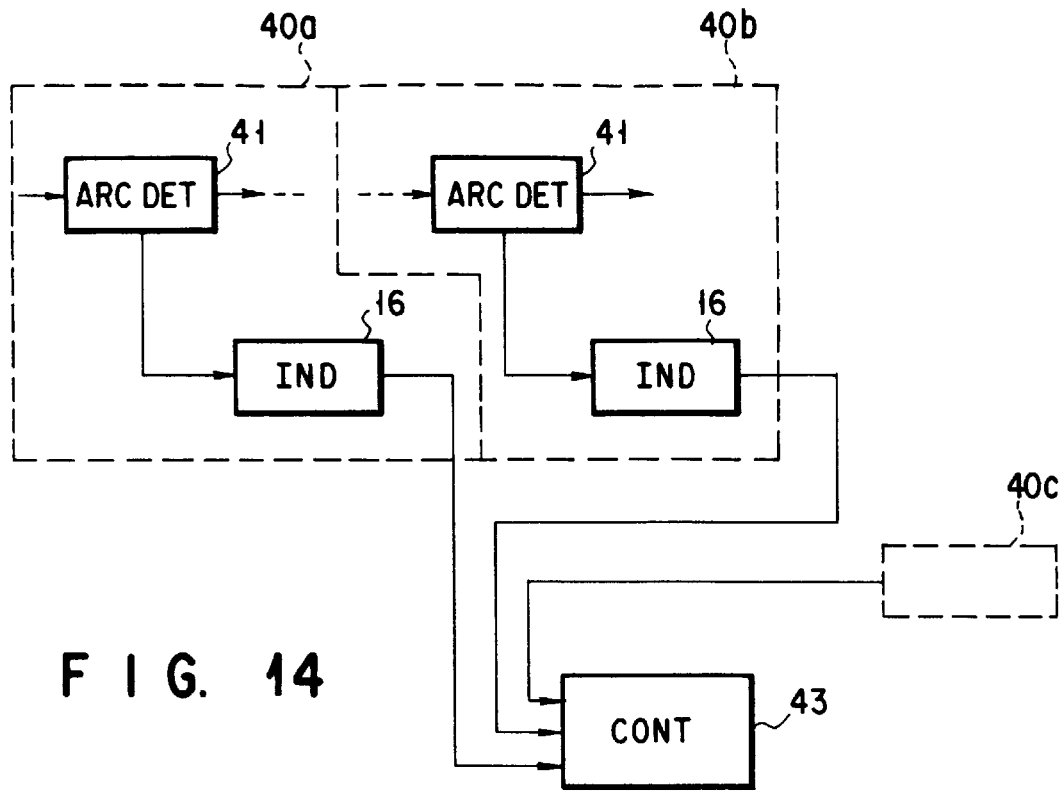
F I G. 14

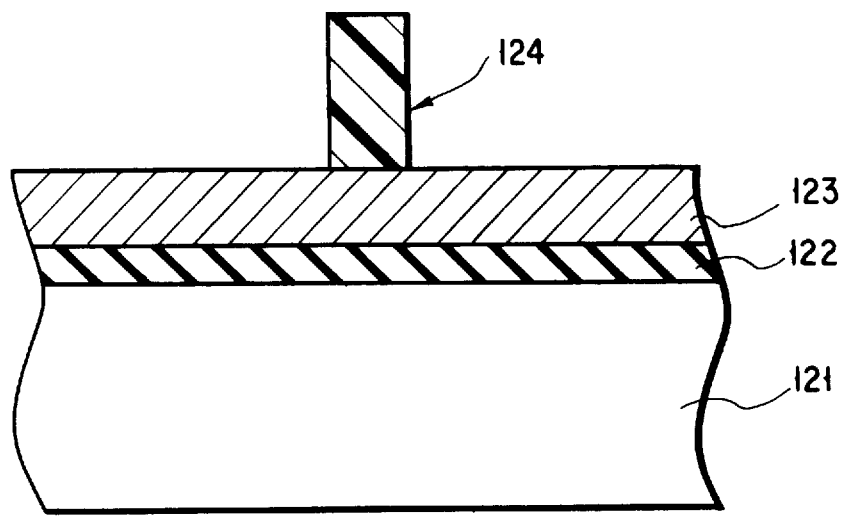
F I G. 16A
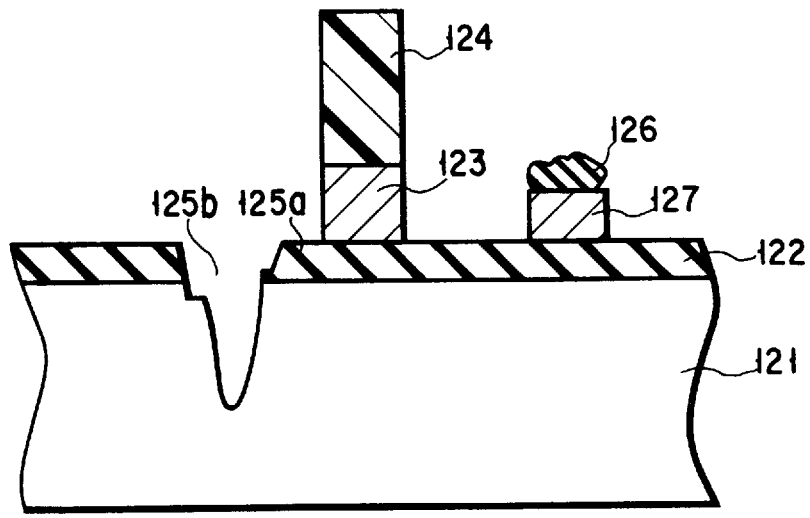
F I G. 16B

PLASMA PROCESSING APPARATUS AND METHOD

BACKGROUND OF THE INVENTION

1. Field of the Invention

The present invention relates to a plasma processing apparatus and method, and, more specifically, to a technique for subjecting a target object, such as a semiconductor wafer or an LCD substrate, to a process, such as etching or film formation, while using plasma, in semiconductor device manufacture.

2. Description of the Related Art

In recent years, as semiconductor devices such as a microprocessor, a random access memory (RAM) and the like have been integrated with a higher density, plasma processing techniques have become indispensable for processes of manufacturing semiconductor devices. For example, in order to form a film of a high purity, a CVD (chemical vapor deposition) method is used, in which a plasma generated from an inorganic material gas or an organic material gas is utilized. Further, to form a fine device region, a wiring, and the like, an RIE (reactive ion etching) method is used, in which a process gas is turned into a plasma, and activated species, such as ions, in the plasma are radiated onto a semiconductor substrate having a patterned resist layer and the like.

FIG. 15 shows a conventional plasma processing apparatus of the parallel plate electrode type.

The plasma process chamber 101 is an air-tight container made of, e.g., aluminum whose surface is covered with an alumite layer. A susceptor 103 for mounting a target substrate 102 is provided in the plasma process chamber 101. The susceptor 103 functions as a cathode electrode or a lower electrode. In contrast, the grounded plasma process chamber 101 functions as an anode electrode or an upper electrode opposite to the susceptor 103.

During a plasma process, the plasma process chamber 101 is supplied with a process gas through a gas inlet port 104 while being exhausted by a turbo molecular pump, an oil diffusion pump (not shown), so that it is kept at a constant pressure. In addition, a radio frequency (RF) power generated by an RF power supply 105 is amplified to a power of a level required for generating a plasma, by an RF amplifier 106. The RF power thus amplified is applied to the susceptor 103 through a directional coupler 107 and a matching circuit 108.

In the directional coupler 107, a progressive wave to the susceptor 103 is separated from a reflection wave from the susceptor 103. A controller 109 controls a variable reactance element, such as a variable capacitor of the matching circuit 108, such that the voltage of the reflection wave is minimum and that the voltage of the progressive wave is maximum. In other words, the controller 109 operates the matching circuit 108 such that the impedance of the RF power applied to the susceptor 103 is matched with the impedance of a generated plasma, thus supplying the susceptor 103 with a maximum power.

As described above, the inside of a plasma process chamber 101 is generally covered with an alumite layer, in order to prevent metal contamination of, e.g., the target substrate 102. The alumite layer is conventionally formed to have a thickness of about 100 nm by an anode oxidation method. In case of etching which generates reaction products at a relatively low vapor pressure, a deposition film is easily formed on the alumite layer.

Where a deposition film is formed by repeating processing steps, charging-up occurs at the surface of the deposition film. If a number of small arc discharge phenomena occur near the surface of the deposition film due to some reasons, a large amount of deposition film is peeled, and dust occurs. Dust is a factor which causes problems of short-circuiting of wirings, disconnections thereof, and the like. In order to prevent these problems, it is necessary to perform maintenance such as cleaning of the plasma process chamber 101 before the thickness of the deposition film reaches a certain thickness at which the deposition film starts being peeled. However, it is not easy to accurately find the timing of performing the maintenance.

In addition, when a metal wiring such as aluminum or the like is formed by etching, a $Cl_2$ gas or a $BCl_3$ gas is introduced into the plasma process chamber 101, thereby to generate a plasma. Since the $Cl_2$ gas and the $BCl_3$ gas have a high reactivity, the alumite layer at the surface of the plasma process chamber 101 is etched little by little. When the alumite layer is etched and removed, aluminum of the inner wall is exposed. In this situation, when abnormal discharge such as arc discharge as described above occurs problems appear in that aluminum of the inner wall or metal impurities such as iron, magnesium or the like contained in aluminum contaminate the target substrate. However, it is not easy to know the lifetime of the plasma process chamber 101 until aluminum is exposed. Further, if abnormal discharge thus occurs, the target substrate is damaged, so that the elemental devices cause electrostatic break-down or are degraded, thereby greatly reducing the production yield. For example, FIG. 16A shows a case where an RIE apparatus of a parallel plate-type is used to form a fine gate electrode of a semiconductor device having a MOS structure.

At first, as shown FIG. 16A, an oxide film 122 for forming a gate oxide film is formed on the entire surface of a silicon substrate 121. A polysilicon thin film 123, doped with impurities such as phosphorus, arsenic, and the like, which is used as gate electrode material is deposited on the oxide film 122. Then, a resist pattern 124 is formed by a photolithography method, so as to comply with the shape of a gate electrode to be processed.

In an RIE apparatus, although a plasma is generated in a radio frequency glow discharge region, abnormal discharge such as arc discharge or the like may occur depending on process conditions such as shapes of convex and concave portions in the plasma process chamber and gases introduced. The arc discharge leads to various problems such as a decrease in productivity due to damages on target substrates, troubles in the plasma processing apparatus, etc.

If arc discharge occurs near the surface of a target substrate, the shape of the target substrate becomes abnormal and a broken portion may be formed such that the silicon substrate is melted. In addition, this arc discharge may cause electrical damage such as a decrease in the withstanding voltage, even when the gate oxide film does not reach a dielectric breakdown or a breakdown. Further, in the case where arc discharge occurs at a position apart from a target substrate in a plasma process chamber, particles stick to the surface of the target substrate and serve as a mask which will cause disconnection or short-circuiting of elements or wirings.

A malfunction caused by arc discharge as described above is shown in FIG. 16B. In this figure, references 125a and 125b are electrically damaged portions of the gate oxide film and the substrate. The reference 126 denotes particles sticking, and the reference 127 denotes an etching residue formed by the particles 126 serving as a mask.

In order to solve the problems as described above, Japanese. Pat. Appln. KOKAI Publication No. 6-119997 discloses a technique in which a parallel resonance circuit for detecting abnormal discharge is connected between a susceptor and a matching circuit, and an RF power supply is controlled on the basis of detection signals from the resonance circuit. However, in this technique, the resonance circuit achieves only a low response speed, so that occurrence of abnormal discharge cannot be sufficiently restricted.

SUMMARY OF THE INVENTION

The present invention has an object of providing a plasma processing apparatus and method which achieve improvements in yield by rapidly and exactly detecting abnormal discharge in a process chamber.

Another object of the present invention is to provide a plasma processing apparatus and method which are capable of reducing sudden occurrences of dust, damages on the surface of a target substrate, contamination of the substrate, and dielectric breakdown of electric devices of the substrates.

According to a first aspect of the present invention, there is provided a plasma processing apparatus comprising:
an airtight process chamber;
a support mechanism for supporting a target substrate in the process chamber;
an exhaust for exhausting the process chamber and setting the process chamber in a vacuum state;
a supply for supplying a process gas into the process chamber;
a first electrode for forming an electric field in the process chamber, thus turning the process gas into plasma;
an RF power supply for supplying an RF power to the first electrode;
a matching mechanism for matching impedance of the RF power with impedance of the plasma;
an extraction mechanism for extracting a reflection wave of the RF power reflected by the first electrode;
a wave detection mechanism for subjecting the reflection wave to envelope wave detection to generate a wave detection signal; and
an examination mechanism for determining the presence or absence of an occurrence of abnormal discharge, from changes in amplitude of the wave detection signal.

According to a second aspect of the present invention, there is provided a plasma processing apparatus comprising:
an airtight process chamber;
a support mechanism for supporting a target substrate in the process chamber;
an exhaust for exhausting the process chamber and setting the process chamber in a vacuum state;
a supply for supplying a process gas into the process chamber;
a first electrode for forming an electric field in the process chamber, thus turning the process gas into plasma;
an RF power supply for supplying an RF power to the first electrode;
a mechanism for radiating a microwave into the plasma;
an extraction mechanism for extracting a reflection wave of the microwave reflected by the plasma or extracting a passing wave of the microwave passing through the plasma;
a wave detection mechanism for subjecting the reflection wave or the passing wave to envelope wave detection to generate a wave detection signal; and
an examination mechanism for determining presence or absence of an occurrence of abnormal discharge, from changes in amplitude or phase of the wave detection signal.

According to a third aspect of the present invention, there is provided a plasma processing method comprising the steps of:
placing a target substrate in an airtight process chamber;
supplying a process gas into the process chamber;
supplying an RF power to a first electrode, thus generating an electric field in the process chamber and turning the process gas into plasma;
matching impedance of the RF power with impedance of the plasma;
subjecting the target substrate placed in the process chamber to a process, using the plasma;
extracting a reflection wave of the RF power reflected by the first electrode;
subjecting the reflection wave to envelope wave detection thus generating a wave detection signal; and
examining and determining the presence or absence of an occurrence of abnormal discharge, from changes in amplitude of the wave detection signal.

According to a fourth aspect of the present invention, there is provided a plasma processing method comprising the steps of:
placing,a target substrate in an airtight process chamber;
supplying a process gas into the process chamber;
supplying an RF power to a first electrode thus generating an electric field in the process chamber and turning the process gas into plasma;
subjecting the target substrate placed in the process chamber to a process, using the plasma;
radiating a microwave into the plasma;
extracting a reflection wave of the RF power reflected by the first electrode or extracting a passing wave of the microwave passing through the plasma;
subjecting the reflection wave or the passing wave to envelope wave detection thus generating a wave detection signal; and
examining and determining the presence or absence of an occurrence of abnormal discharge, from changes in amplitude or phase of the wave detection signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a view schematically showing a plasma processing apparatus according to another embodiment of the present invention;

FIG. 6 is a view showing a wave detection signal of a reflection wave when abnormal discharge is damped by operating an RF switch, in the embodiment shown in FIG. 1;

FIG. 7 is a view showing a wave detection signal obtained by performing envelope wave detection on the reflection wave of a microwave, when abnormal discharge is caused, in the embodiment shown in FIG. 5;

FIG. 8 is a view showing a wave detection signal obtained by performing envelope wave detection on the passing wave of a microwave, when abnormal discharge is caused, in the embodiment shown in FIG. 5;

FIG. 11 is a view schematically showing a test device for explaining the principle of the embodiment shown in FIG. 1;

FIG. 12 is a view schematically showing a plasma processing apparatus according to still another embodiment of the present invention;

FIG. 13 is a view showing a change in the number of arch discharge occurrences;

FIG. 14 is a view schematically showing a modification of the embodiment shown in FIG. 12;

FIGS. 16A and 16B are sectional views for explaining problems in the case of forming a fine gate electrode of a MOS-type semiconductor device with use of a conventional apparatus.

DETAILED DESCRIPTION OF THE PREFERRED EMBODIMENTS

Figure 1:
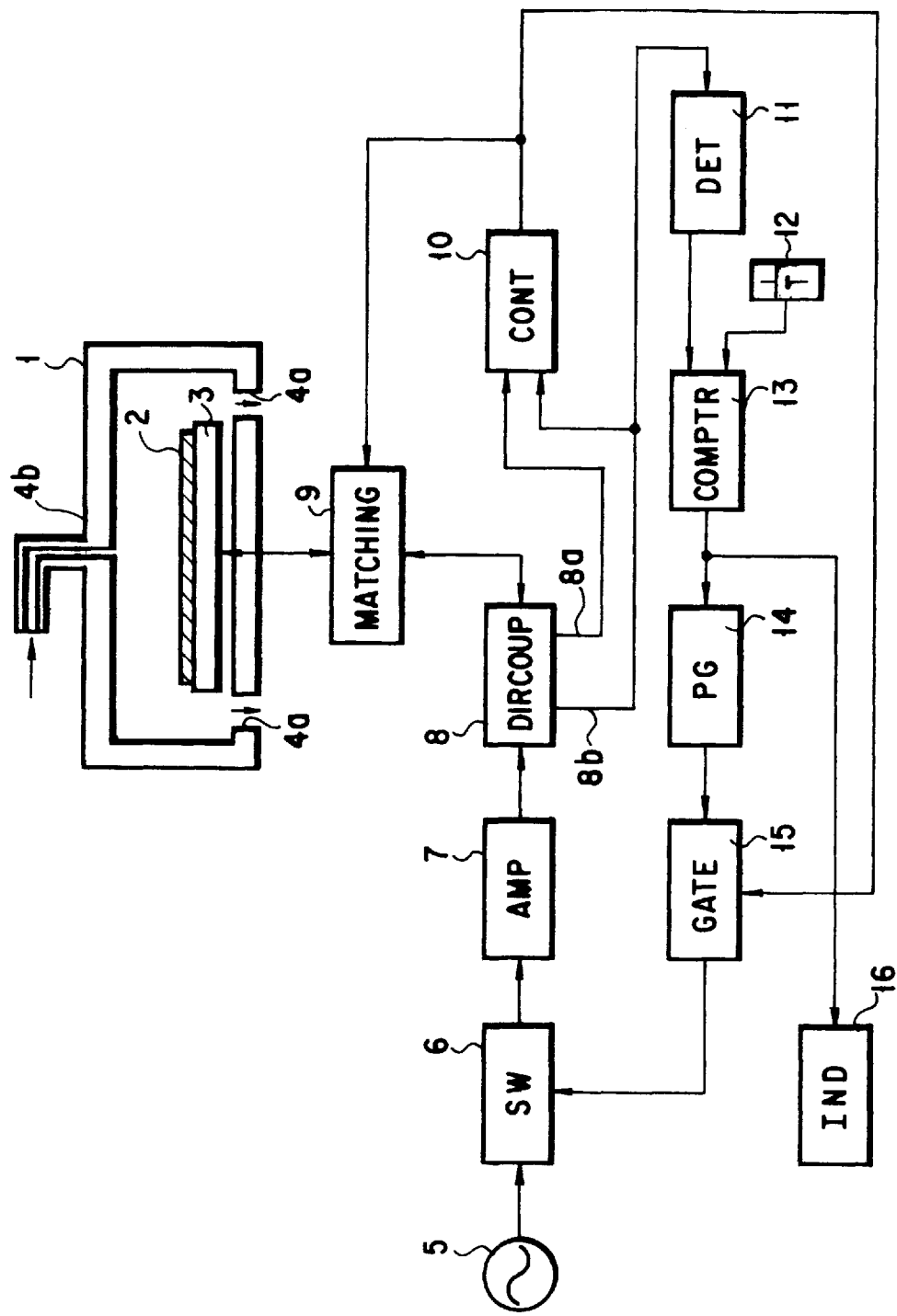
FIG. 1 is a view schematically showing the structure of a plasma processing apparatus according to an embodiment of the present invention.

FIG. 1 is a view schematically showing a plasma etching apparatus according to an embodiment of the present invention.

A plasma process chamber 1 is an airtight container made of a conductive material, such as aluminum, whose surface is covered with an alumite layer. A susceptor 3 for mounting a target substrate 2 is provided in the plasma process chamber 1. The susceptor 3 functions as a cathode electrode or a lower electrode. On the other hand, the plasma process chamber 1 is grounded and functions as an anode electrode or an upper electrode opposite to the susceptor 3.

During a plasma process, the plasma process chamber 1 is supplied with a process gas through a gas inlet port 4b while being exhausted through an outlet port 4a by a turbo molecular pump, an oil diffusion pump (not shown), so that it is kept at a constant pressure. In addition, a radio frequency (RF) power of 13.56 MHz generated by an RF power supply 5 is transmitted through an RF switch 6 and amplified to a power of a level required for generating a plasma by an RF amplifier 7. The RF power thus amplified is applied to the susceptor 3 through a directional coupler 8 and a matching circuit 9.

As a result of application of an RF power, an RF electric field is formed between the susceptor 3 and the plasma process chamber 1. Discharging is caused by the RF electric field, and the process gas is turned into a plasma. Further, this plasma is used to perform predetermined plasma processing, i.e., RIE (reactive ion etching) on a target substrate 2. Note that this discharge normally occurs in a glow discharge region, and that the cathode electrode regularly charges up a negative potential and draws ions to the surface of the target substrate, by arranging the area of the upper wall of the grounded chamber 1 as a anode electrode larger than the cathode electrode.

Figure 15:
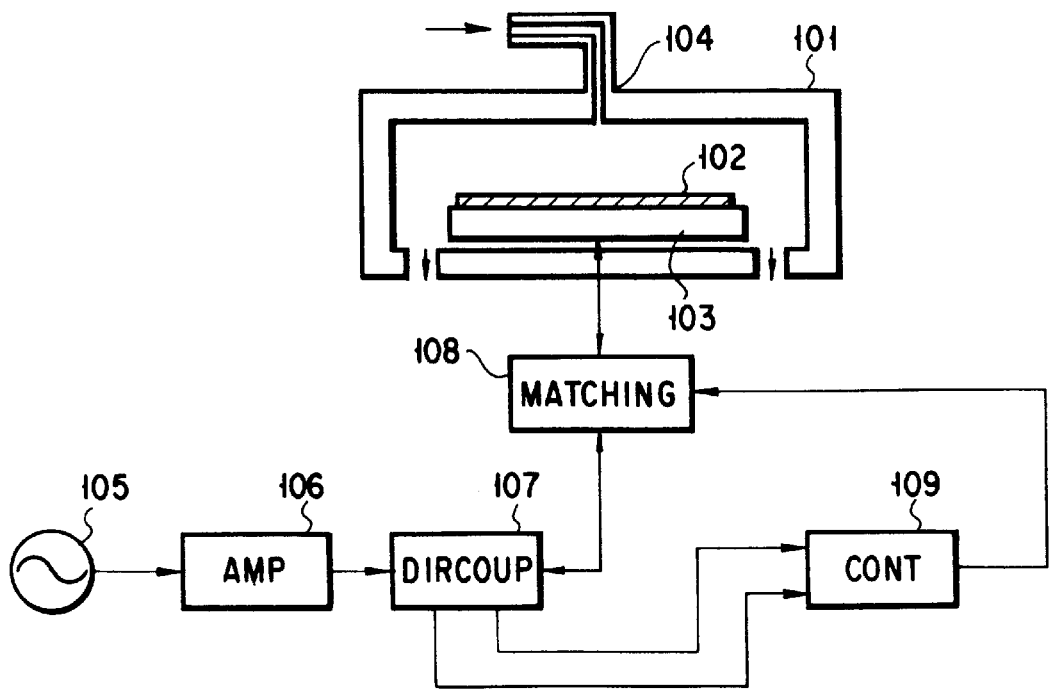
FIG. 15 is a view schematically showing a conventional plasma processing apparatus.

In the directional coupler 8, a progressive wave 8a to the susceptor 3 is separated from a reflection wave 8b from the susceptor 3. A controller 10 controls the variable reactance element such as a variable capacitor or the like of the matching circuit 9, such that the voltage of the reaction wave is minimized and the voltage of the progressive wave is maximized. Specifically, the controller 10 controls the matching circuit 9 such that the impedance of the RF power matches with the impedance of the generated plasma. As a result of this, the maximum power is supplied to the susceptor 3. In this respect, the progressive wave 8a and the reflection wave 8b are used in the same manner as in the prior art technique described above with reference to FIG. 15.

In a plasma process, there is a case that abnormal discharge, such as arc discharge, is caused in the plasma process chamber 1. The generation frequency and the generation scale of abnormal discharge, such as arc discharge, vary depending on plasma processing conditions, such as the plasma generation method, the areas of the electrodes, the distance between the electrodes, and the conditions of the plasma process chamber, e.g., the geometrical shape of the chamber, the surface treatment of the inner wall of the chamber, and the like, as well as plasma processing conditions, such as the type of the introduced gas, the pressure inside the plasma process chamber, and the frequency and the power value of the applied RF power.

Under a condition that an insulating film is formed by performing a surface treatment in order to improve the durability of the inner wall of the plasma process chamber, or reaction products are deposited on the surface of the inner wall, it is assumed that the electric potential has a certain distribution over the entire inner wall of the chamber or at a local portion thereof, depending on the conductivity of the film or the film thickness. In addition, it is considered that the potential distribution appears due to the physical characteristics or shape of the surface of a target substrate. It is further considered that those complicated factors influence each other, thereby causing arc discharge in the plasma process chamber.

From this point of view, experiments have repeatedly been conducted, and it has been found that the reflection wave of an RF power from the susceptor (or the cathode electrode) can be used to rapidly and exactly detect abnormal discharge such as arc discharge. In those experiments, as shown in FIG. 11, a reflection wave from the susceptor 3, obtained by the directional coupler 8, was made to pass through the wave detector 11, and was thereafter displayed on an oscilloscope 18. As a result of this, a pulse-like reflection wave considered to be induced by arc discharge during the plasma processing was observed.

The following is considered as the reason why the arc discharge generates a reflection wave of a pulse-like form. At first, when arc discharge is caused, a large current flows through the arc discharge. As a result of this, the impedance of the plasma as a whole becomes lower than the impedance obtained when glow discharge is steadily generated. Since the matching circuit is subjected to impedance matching with the condition of the glow discharge, the reflection RF wave goes out of a matching point and runs toward the RF power supply.

In recent years, an automatic matching circuit which automatically performs impedance matching is often used, but cannot at all accord to impedance changes caused by arc discharge, since the automatic matching circuit is based on mechanical control, e.g., a method of operating a variable capacitor or a variable reactor by means of an electromagnetic motor. Therefore, a pulse-like reflection wave can be detected even with use of any kind of matching method. Accordingly, the abnormal discharge in the process chamber can be rapidly and exactly detected by monitoring the reflection wave of an RF power from the susceptor (or the cathode electrode).

Figure 2:
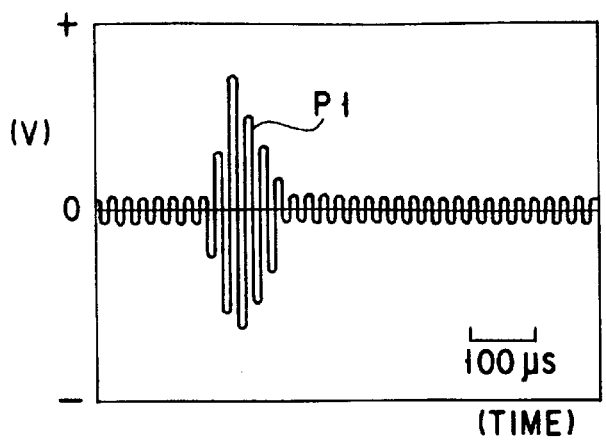
FIG. 2 is a view showing a reflection wave of an RF power extracted from a directional coupler when abnormal discharge is caused in the embodiment shown in FIG. 1.
Figure 3:
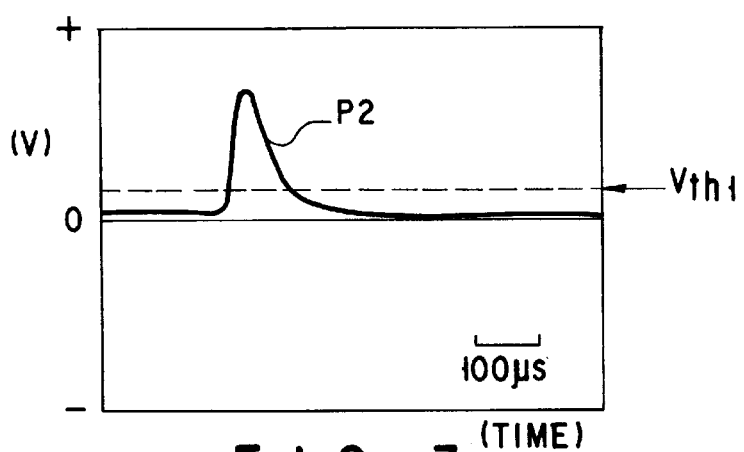
FIG. 3 is a view showing a wave detection signal obtained by performing envelope wave detection on the reflection wave shown in FIG. 2.

More specifically, in the apparatus shown in FIG. 1, when abnormal discharge such as arc discharge is caused in the plasma process chamber 1 during the plasma processing, a pulse-like output waveform P1, as shown in FIG. 2 is generated in a reflection output 8b of the directional coupler 8. This generated reflection output waveform P1 is subjected to the envelope wave detection by a wave detector 11, and an output signal P2 having a waveform shown in FIG. 3 is obtained. Note that FIGS. 2 and 3 show voltage waveforms obtained when operation for reducing abnormal discharge is not performed with an RF switch 6 being continuously kept ON regardless of the presence or absence of abnormal discharge.

An output signal P2 detected by the wave detector 11 is compared by a voltage comparator 13 with a reference direct current voltage Vth1 (indicated by a broken line in FIG. 3) generated by a reference voltage source 12. When the output signal P2 attains a voltage equal to or higher than the reference voltage, it is regarded that abnormal discharge is caused, and a trigger signal is generated for operating a pulse generator 14. Upon receipt of the trigger signal, the pulse generator 14 generates an RF cut-off pulse. The RF cut-off pulse is transmitted to an RF switch 6 through a gate circuit 15, thus turning off the switch 6. In this manner, supply of RF power to the susceptor 3 is stopped and abnormal discharge is damped.

Figure 4:
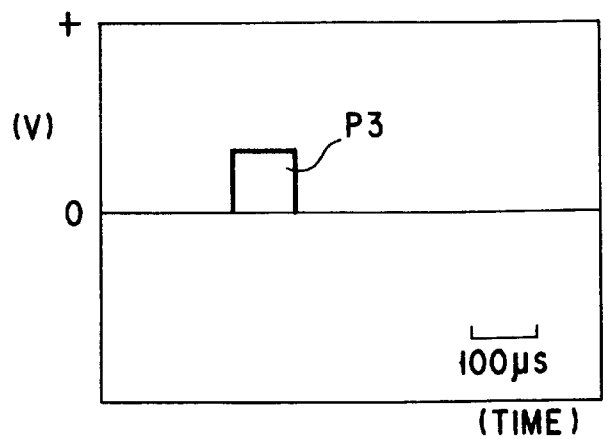
FIG. 4 is a view showing an RF cut-off pulse outputted from a pulse generator when abnormal discharge is caused in the embodiment shown in FIG. 1.

FIG. 4 shows an RF cut-off pulse P3 generated by a trigger signal by the pulse generator 14. The RF cut-off pulse P3 is maintained for a time period substantially equal to or slightly longer than the duration of the abnormal discharge shown in FIG. 2, i.e., the duration of the pulse-like output waveform P1.

Next, the function of the gate circuit 15 will be explained.

The RF switch 6 is normally kept turned ON, i.e., the switch normally allows RF power to pass. When RF power is generated and a plasma is generated in the plasma process chamber 1, the matching circuit 9 and the controller 10 perform the impedance matching operation as describe above for several seconds. During this matching operation, the controller 10 closes the gate circuit 15 so that an RF cut-off pulse from the pulse generator 14 does not pass. As a result of this, the RF switch 6 is able to maintain the ON-state while the matching operation is performed after RF power starts to be generated.

In order to detect completion of the matching operation, the controller 10 determines whether or not the voltage of the progressive wave 8a is at certain threshold value or higher, or whether or not the voltage of the reflection wave is a certain threshold value or lower. If the voltage of the progressive wave 8a is equal to or higher than the certain threshold value, of if the voltage of the reflection wave is equal to or lower than the certain threshold value, the matching operation is recognized as completed, and the controller 10 makes the gate circuit 15 open. As a result of this, an RF cut-off pulse from the pulse generator 14 is allowed to pass through the gate circuit 15, and the above described feedback control for restricting the abnormal discharge is enabled.

Specifically, the RF cut-off pulse is not transmitted to the RF switch 6 during the impedance matching operation, due to the function of the gate circuit 15. This is because the voltage of the reflection wave exceeds the reference direct current voltage Vth1 of the reference voltage source 12 during the impedance matching operation between the RF power supply and the plasma. If this excessive voltage is mistaken as abnormal discharge, it is possible to cause an oscillation phenomenon, i.e., to cause the RF power to be repeatedly switched by the RF switch 6 such that the RF power is turned ON after the cut-off pulse period in which the RF power is turned OFF (or cut off).

This is considered as a drawback caused by an increased speed from detecting abnormal discharge occurrence up to starting control of the RF power, so that an oscillation phenomenon which has not been conventionally measured is detected, in the present embodiment. Therefore, according to this embodiment, in order to prevent erroneous operation, control of the RF power is not performed by the gate circuit 15 when information that the impedance is not matched is supplied from the controller 10.

Note that a pulse count (or arc count) indicator 16 counts the number of abnormal discharge occurrences, thus knowing the extent of how the deposition film of the plasma process chamber 1 glows or is worn and uses the count as a hint for maintenance of the plasma process chamber 1 or replacement of the chamber 1.

Dry etching was performed with use of this plasma processing apparatus, and a reflection pulse waveform obtained whose arc was partially erased in the process of generating abnormal discharge, as shown in FIG. 6 at a reference P4. In this figure, a broken line shows a waveform when the operation of reducing abnormal discharge according to the present embodiment was not performed. In addition, an effect was recognized by the pulse count indicator 16 such that the generation frequency of abnormal discharge was reduced by about 60% to 80%. Further, the wearing of the plasma process chamber 1 was reduced and the lifetime was elongated.

The cut-off pulse period is set to be substantially equal to or longer than the duration period of abnormal discharge and not to exceed the period which extinguishes the plasma and influences the matching operation. In other words, the cut-off pulse period is set to be equal to or shorter than a period with which the temperature of electrons in the plasma damps. Specifically, the cut-off pulse period is set preferably at 10 microseconds to 10 milliseconds, and more preferably at 50 microseconds to 500 microseconds.

Although abnormal discharge is detected by comparing an output signal of the wave detector 11 with a direct current reference voltage, according to the present embodiment, abnormal discharge may be detected by subjecting the output signal of the wave detector 11 to pulse-discrimination by means of a differentiation circuit.

FIG. 5 is a view schematically showing a plasma processing apparatus according to another embodiment of the present invention. The gas supply system and the exhausting system of this apparatus are the same as those of the apparatus shown in FIG. 1. Therefore, the same components are referred to by the same references, and their detailed explanation will be omitted.

In the apparatus shown in FIG. 5, during a plasma process, a plasma process chamber 1 is supplied with a process gas while being exhausted, so that it is kept at a constant pressure, as in the apparatus shown in FIG. 1. In addition, an RF power of 13.56 MHz generated by an RF power supply 5 is transmitted through an RF switch 6 and amplified to a power of a level required for generating a plasma, by an RF amplifier 7. The RF power thus amplified is applied to a susceptor 3 through a directional coupler 8 and a matching circuit 9.

Meanwhile, a microwave of 35 GHz is generated from a microwave source 21 and is emitted through a microwave directional coupler 22 of a porous type and a transmission horn antenna 23. The emitted microwave is radiated into the plasma process chamber 1 through a first quartz window 24.

The electron density $n_e$ of a plasma conventionally used in the plasma processing apparatus is $10^9/cm^3$ to $10^{13}/cm^3$. In this state, the plasma frequency $W_F$ (which is proportional to $n_e^{0.5}$) falls within a microwave range of about 10 GHz to 1000 GHz. When a microwave having a higher frequency than a plasma frequency is radiated into a uniform plasma in which abnormal discharge is not generated, the microwave is propagated through the plasma without damping.

When abnormal discharge is caused in the plasma process chamber, the electron density $n_e$ is locally increased, and, accordingly, the plasma frequency is increased. When the plasma frequency exceeds the frequency of the radiated microwave, the microwave cannot be propagated through the plasma but damps. This phenomenon is called cutting-off. Simultaneously, the microwave is reflected.

The microwave reflected from the plasma due to generation of abnormal discharge enters into the transmission horn antenna 23. The reflection wave thus entering is extracted by the microwave directional coupler 22, and is subjected to envelope wave detection by the first microwave detector 27. FIG. 7 shows a wave-detection output voltage from the first microwave detector 27 when abnormal discharge is caused. When abnormal discharge is caused, a pulse waveform P5 accompanying the abnormal discharge is obtained, as in the embodiment shown in FIG. 1.

Meanwhile, a microwave which has passed through a plasma is guided to a receive horn antenna 26 from a second quartz window of the plasma process chamber 1. The passing microwave obtained by the receive horn antenna 26 is subjected to envelope wave detection by a second microwave detector 28. FIG. 8 shows a wave-detection output voltage from the second microwave detector 28 when abnormal discharge is caused. When abnormal discharge is caused, a pulse waveform P6 which decreases in accordance with abnormal discharge is obtained, in contrast to the case of FIG. 7.

While plasma is generated and a process is performed, the voltage comparator 13 sends a trigger signal to a pulse generator 14 when the output of the first microwave detector 27 for detecting the reflection wave of the microwave becomes equal to or higher than a direct current reference voltage Vth2 generated by a reference voltage source 12. Otherwise, the voltage comparator 13 sends a trigger signal to the pulse generator 14 when the output of the second microwave detector 28 for detecting the passing wave of a microwave becomes equal to or lower than a direct current reference voltage Vth3 generated by the reference voltage source 12.

Whether a reflection wave of a microwave or a passing wave of a microwave is used is decided by switching the switches 29a and 29b. In addition, a logic inverter 30 is used to switch the output of the voltage comparator 13 between positive logic and negative logic.

In each of the cases of using a reflection wave and a passing wave, abnormal discharge was reduced by cutting off the RF power for a predetermined period of time by means of the RF switch 6, as in the embodiment shown in FIG. 1.

Note that, in the embodiment shown in FIG. 5, abnormal discharge is detected by detecting the amplitude of the reflection wave or passing wave of the microwave. Otherwise, abnormal discharge may be detected by detecting changes in the phase of the reflection wave or passing wave of the microwave, e.g., by detecting a difference in the phase changes between the reflection wave and the passing wave.

Figure 9:
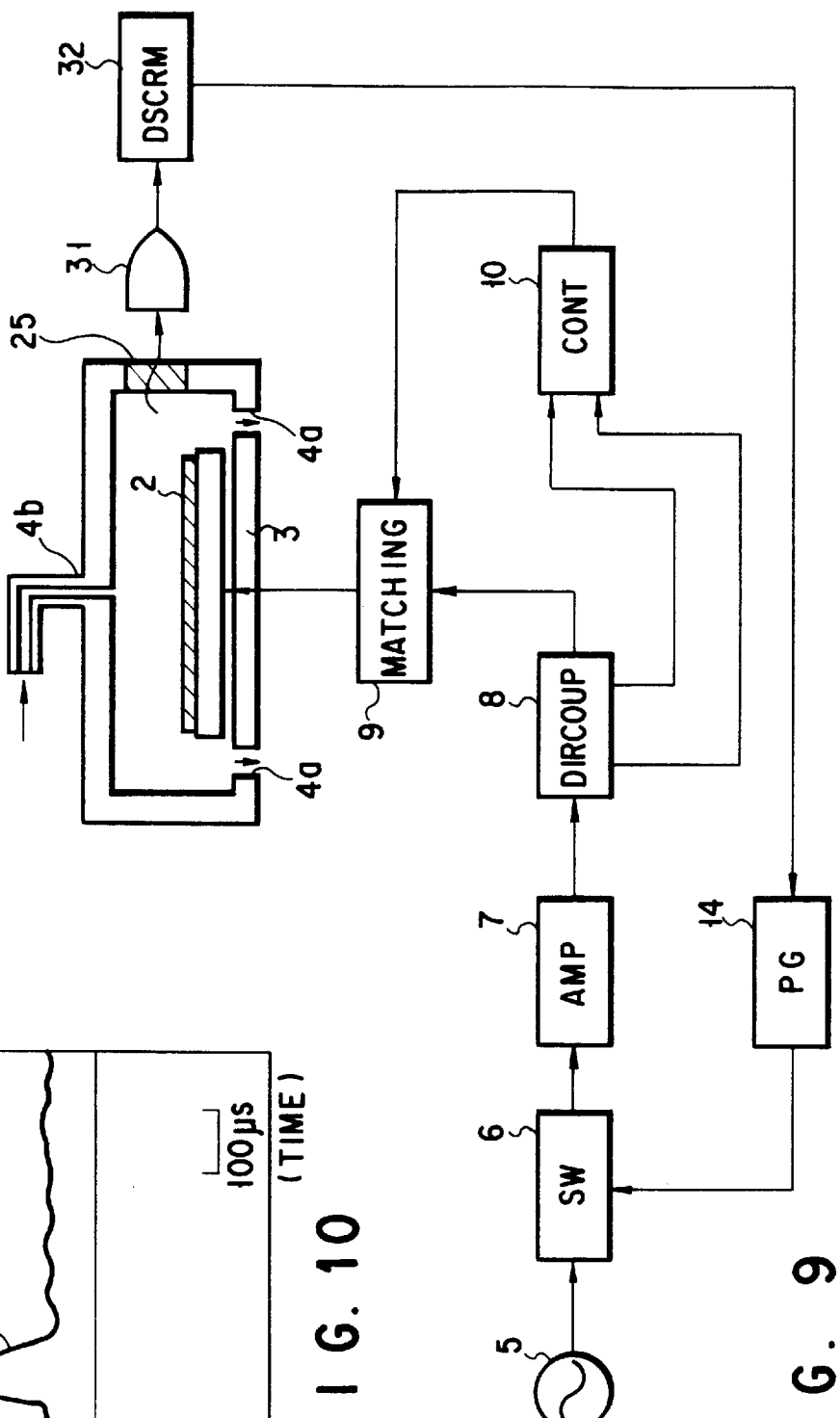
FIG. 9 is a view schematically showing a plasma processing apparatus according to still another embodiment of the present invention.

FIG. 9 is a view schematically showing a plasma processing apparatus according to still another embodiment of the present invention. The gas supply system and the exhausting system of this apparatus are the same as those of the apparatus shown in FIG. 1. Therefore, the same components are referred to by the same references, and their detailed explanation will be omitted.

In the apparatus shown in FIG. 9, during a plasma process, a plasma process chamber 1 is supplied with a process gas while being exhausted, so that it is kept at a constant pressure, as in the apparatus shown in FIG. 1. In addition, an RF power of 13.56 MHz generated by an RF power supply 5 is transmitted through an RF switch 6 and amplified to a power of a level required for generating a plasma, by an RF amplifier 7. The RF power thus amplified is applied to a susceptor 3 through a directional coupler 8 and a matching circuit 9.

Figure 10:
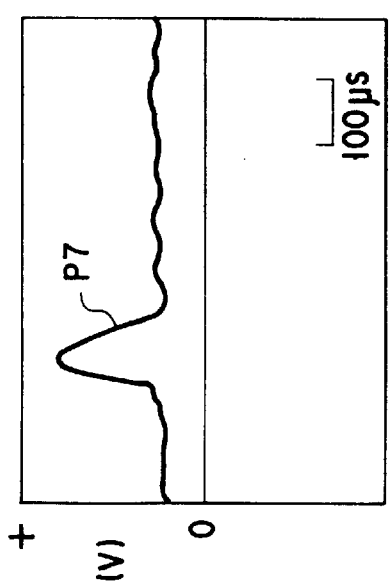
FIG. 10 is a view showing an output signal obtained by an emission intensity detector when abnormal discharge is caused, in the embodiment shown in FIG. 9.

Here, if abnormal discharge is caused while a plasma is generated and a process is performed, the emission intensity is increased. Then, the emission intensity of a plasma extracted from a quartz window 25 is detected by an emission intensity detector 31. FIG. 10 shows a detection output of an emission intensity detector 31 when abnormal discharge is caused. When abnormal discharge is caused, a pulse waveform P7 accompanying abnormal discharge is obtained. From the detected light, a pulse discriminator 32 extracts only those changes in emission intensity which are caused by abnormal discharge for about 50 micro seconds to 50 macro seconds, and outputs a trigger signal. This selective extraction is performed in order to avoid erroneous operation due to changes in emission intensity caused by a factor other than abnormal discharge, during plasma processing.

By forming a pulse of a predetermined period of time in a pulse generator 14 on the basis of the trigger signal obtained by the pulse discriminator 31, as in the embodiments shown in FIGS. 1 and 5, and by using the RF switch 6 to cut off the RF power for the predetermined period of time, abnormal discharge can be reduced.

In the embodiment shown in FIG. 9, abnormal discharge is detected by detecting changes in emission intensity entering into the emission intensity detector 31. However, it is possible to perform more precise detection of abnormal discharge, by providing a spectrometer for the emission intensity detector 31, to detect the wavelength of specified ions or activated species relating to abnormal discharge.

In the embodiments shown in FIGS. 1, 5, and 9, the RF power is cut off, i.e., the power value is reduced to zero to reduce generation of abnormal discharge. However, the output of the RF power need not be cut off completely, but it will be enough to reduce the power to a certain value higher than zero. Also, as for the embodiments shown in FIGS. 1, 5, and 9, explanation has been made to apparatuses in which an RF power is applied to a susceptor to generate a plasma. However, in an apparatus using inductive coupling, plasma electron cyclotron resonance, a helicon wave or the like, to generate a plasma, abnormal discharge can be damped by cutting off or reducing the output of the RF power, microwave, helicon wave, or the like of the mechanism for generating plasma upon generation of the abnormal discharge. In addition, in the case of applying an RF bias to the susceptor, the RF bias may be reduced or cut off.

According to the embodiments shown in FIGS. 1, 5, and 9, it is possible to reduce sudden generation of dust, damages on the surface of a target substrate, contamination of the substrate, dielectric breakdown of electric elements of the substrate, and the like which are caused by abnormal discharge, by means of detecting generation of abnormal discharge in a plasma process chamber and of damping abnormal discharge.

FIG. 12 schematically shows a plasma processing apparatus (or an etching apparatus) according to still another embodiment of the present invention. The gas supply system and the exhausting system of this apparatus are the same as those of the apparatus shown in FIG. 1. Therefore, the same components are referred to by the same references, and their detailed explanation will be omitted.

In the apparatus shown in FIG. 12, during a plasma process, a plasma process chamber 1 is supplied with a process gas while being exhausted, so that it is kept at a constant pressure, as in the apparatus shown in FIG. 1. In addition, an RF power of 13.56 MHz generated by an RF power supply 5 is amplified to a power of a level required for generating a plasma by an RF amplifier 7. The RF power thus amplified is applied to a susceptor 3 through a matching circuit 9.

An arc detector 41 for detecting arc discharge (or abnormal discharge) on the basis of impedance changes of a plasma is inserted between the RF power supply 5 and the matching circuit 9. For example, the arc detector 41 may have a structure as a combination of a directional coupler 8, a wave-detector 11, a reference voltage source 12, and a voltage comparator 13 shown in FIG. 1. In this case, in the arc detector 41, a reflection wave 8b from the susceptor 3 is detected and compared with a reference direct current voltage, thus detecting arc discharge (or abnormal discharge). A detection signal from the arc detector 41 is supplied to an arc count indicator 16, and this indicator 16 counts and displays the number of arc discharge occurrences for a predetermined time.

Note that the arc detector 41 may be a detector which detects impedance changes of a plasma, or may be a detector which directly detects changes in amplitude or phase of the RF power supplied from the RF power supply 5.

A magnet 42 is provided outside the plasma process chamber 1. This magnet 42 creates a magnetic field substantially parallel to the surface of the susceptor (or cathode electrode) 3, and makes electrons drift in a cathode sheath, thus generating a plasma of a high vacuum and a high density. As a result of this, the etching speed is increased and vertical shape of the etched cross-section is achieved.

The next explanation will be made to a method of etching a target substrate with use of chlorine gas, to form a gate electrode, in the apparatus shown in FIG. 12.

The gate oxide film was 12 nm and the doped polysilicon thin film to form a gate electrode was about 300 nm. A chlorine gas was introduced inside, and the pressure inside the plasma process chamber was set at 0.2 Pa. The plasma processing time was decided, depending on end-point determination based on changes in emission intensity of the specified wavelength of a plasma.

When a silicon substrate having a diameter of 150 nm and a thickness of 0.625 mm was used to form a gate electrode under the condition as described above, the arc generation count number was monitored by an arc detector for every 72 substrates. Changes in the arc generation count number are shown in FIG. 13. When about 800 substrates were processed, the arc generation count number suddenly increased. In this case, the rate of excellent quality items was decreased in the semiconductor devices completed throughout the entire manufacturing process.

Then, a silicon substrate having a silicon oxide thin film formed over its entire surface was subjected to a plasma process for one minute under the same condition as described above, a great deal of the particles having sizes of about 0.2 $\mu$m to 2 $\mu$m stuck to the substrate. Among the particles sticking to the silicon substrate, those particles having a size of about 2 $\mu$m were subjected to micro-X-ray fluorometic analysis, and it was found that aluminum was the main component. In addition, the inner wall of the plasma process chamber was subjected to investigation, and found that an alumite layer was partially eliminated.

From the above, it is considered that, when a part of the inner wall was gradually etched and conductive aluminum material was exposed during a plasma process, arc discharge was caused in the vicinity of the exposed portion and particles of aluminum were generated. The above case of silicon substrates used for gate electrodes, are, therefore considered to have resulted in a reduction in rate of good condition items because particles, including aluminum as a main component, similarly stack when arc discharge was caused.

Therefore, in the present embodiment, a target substrate was subjected to ultrasonic cleaning for 10 minutes with use of pure water, was treated with a diluted mixture solution of sulfuric acid and nitric acid for 10 seconds, and was subjected again to pure water ultrasonic cleaning for 10 minutes, after the plasma process, and then, was subjected to normal manufacturing steps for a semiconductor device. In this case, the rate of good quality items to the completed semiconductor devices was improved. It is considered that this improvement was obtained because particles sticking to the silicon substrates were removed, thereby preventing occurrence of defective items caused by defective shapes. In addition, it has been found that particles can be removed by adopting a RCA cleaning method normally called "SC-1."

Further, a heat treatment using a mixture gas of $O_2$ gas and $H_2$ gas was performed at 700° C. for 30 minutes and another heat treatment with use of Ar gas was subsequently performed at 900° C. under a normal pressure, after the treatments using pure water and solution as described above. Thereafter, semiconductor devices were manufactured.

Then, the rate of good quality items to the completed semiconductor devices could be increased much more. It is considered that the rate was improved because electrically damaged portions of gate oxide films other than those portions whose shape were physically damaged by arch discharge were improved.

As described above, an increase in arc generation frequency which influences the non-defective item rate is dependent on elimination of an alumite layer from the inner wall of the plasma process chamber. Therefore, the plasma process chamber was replaced with new one, and then a plasma process was performed in the new chamber. As a result, arc generation was reduced as shown on the right side of FIG. 13, and the original condition could be recovered. This means that the lifetime of a plasma process chamber can be grasped by monitoring the arc generation frequency.

Therefore, the apparatus was arranged such that the arc discharge count number was continuously monitored during a plasma process and an alarm was issued when the number exceeds a certain value. As a result of this, replacement of plasma process chambers could be immediately carried out, and down time of the plasma process chamber could be shortened. Thus, the production efficiency could be raised by preventing deterioration in the operation efficiency of the plasma processing apparatus.

In the embodiment shown in FIG. 12, an etching apparatus using an RIE method or the like has been explained as a plasma processing apparatus. However, the present invention is applicable to any kind of processing apparatus, as far as the processing apparatus uses discharge plasma to perform a process on the surface of a target substrate. For example, the present invention can be applied to deposition of a thin film such as a CVD method. In addition, as shown in FIG. 14, arc detection information from a plurality of plasma processing apparatuses 40a, 40b, and 40c can be collected to an arc discharge count concentrative display controller 49, to much more improve the productivity.

In the embodiment shown in FIG. 12, the plasma process chamber is replaced with a new one on the basis of monitoring of abnormal discharge. Otherwise, the cathode electrode may be replaced with new a one in the case where abnormal discharge is caused by deterioration of the quality of a cathode electrode (or a susceptor). Further, both the chamber and electrode can be replaced with new ones. In addition, in order to remove particles sticking due to arc discharge or to improve electric characteristics, a treatment, such as an etching step, a thin film formation step, or the like, may be adopted, or a combination of these steps may be adopted.

Specifically, the gist of the embodiment is to prevent the productivity from being lowered, by monitoring processing conditions during a plasma process, such as a dry etching method, a CVD method, or the like, which tends to damage a semiconductor device in various manners during its manufacture, and by changing subsequent manufacturing steps on the basis of the information obtained from the monitoring. That is, according to the present embodiment, there is provided a plasma processing apparatus in which a plasma is generated by discharge between electrodes provided in a chamber and is used to perform a predetermined surface process on a target substrate placed in the chamber. This apparatus is characterized by detecting changes in impedance of the plasma to monitor abnormal discharge.

Preferable manners of this apparatus are as follows.

(1) A mechanism for storing data based on monitoring results is provided, and the apparatus is determined as abnormal when the abnormal discharge count number reaches a predetermined number or greater.

(2) A mechanism for monitoring abnormal discharge is arranged to detect changes in amplitude or phase of an RF wave supplied from an RF power supply for generating discharge.

(3) A mechanism for monitoring abnormal discharge is arranged to detect changes in amplitude or phase of a reflection wave of an RF wave.

(4) A mechanism for monitoring abnormal discharge is arranged to detect changes in amplitude or phase of a reflection wave or a passing wave of a microwave radiated into plasma.

(5) A chamber or an electrode is replaced with new one in accordance with the monitoring results.

(6) A target substrate is subjected to a surface process, such as a dry etching, e.g., an RIE method, or a film deposition, e.g., a CVD method.

Further, according to the present embodiment, there is provided a method of manufacturing a semiconductor device, in which a plasma is generated by discharge between electrodes provided in a chamber and is used to perform a predetermined surface process on a targets substrate placed in the chamber. This method is characterized by detecting changes in impedance of the plasma to monitor abnormal discharge, and by determining whether or not the target substrate should,be subjected to a treatment step for recovering a damage caused by abnormal discharge.

Preferable manners of this method are as follows.

(1) As a damage recovery treatment step, at least one of heating treatment, cleaning treatment, polishing treatment, thin film formation, and exposure to a gas atmosphere is performed.

(2) On the basis of monitoring results, subsequent processing to be performed on the target substrate is stopped.

According to the embodiment shown in FIG. 12, since abnormal discharge is monitored by detecting changes in impedance of a plasma, the response speed is high and the sensitivity is also high in comparison with a case of detecting arc emission light, so that abnormal discharge can certainly be monitored. Further, if maintenance of the apparatus (such as replacements of a chamber, an electrode, or the like) is carried out on the basis of monitoring results, down time of the plasma processing apparatus can be shortened and significant malfunctions can also be prevented. Furthermore, since a treatment step for recovering a damage caused by abnormal discharge is performed on the target substrate on the basis of monitoring results, the yield of manufacturing semiconductor devices is improved.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A plasma processing apparatus comprising:

an airtight process chamber;

a support mechanism for supporting a target substrate in said process chamber;

an exhaust for exhausting said process chamber and setting said process chamber in a vacuum state;

a supply for supplying a process gas into said process chamber;

a first electrode for forming an electric field in said process chamber, thereby to turn said process gas into plasma;

an RF power supply for supplying an RF power to said first electrode;

a matching mechanism for matching impedance of said RF power with impedance of said plasma;

an extraction mechanism for extracting a reflection wave of said RF power reflected by said first electrode;

a wave detection mechanism for subjecting said reflection wave to envelope wave detection to generate a wave detection signal; and an examination mechanism for determining presence or absence of an occurrence of abnormal discharge, from changes in amplitude of said wave detection signal.

2. An apparatus according to claim 1, wherein said examination mechanism comprises a comparator for comparing said wave detection signal with a reference voltage.

3. An apparatus according to claim 1, further comprising control mechanism for lowering a power value of said RF power for a period of time, when said examination mechanism determines presence of abnormal discharge.

4. An apparatus according to claim 3, wherein said period of time is set such that said period is equal to or longer than a time period for which abnormal discharge is expected to be maintained and such that said plasma does not disappear.

5. An apparatus according to claim 3, wherein said control mechanism cuts off supply of said RF power for said period of time, when said examination mechanism determines presence of abnormal discharge.

6. An apparatus according to claim 3, further comprising a mechanism for setting power values of said RF power not to be controlled by said control mechanism by a time when impedance of said RF power is matched with impedance of said plasma by said matching mechanism at first.

7. An apparatus according to claim 1, further comprising a mechanism for monitoring the number of occurrences of abnormal discharge, which are determined by said examination mechanism.

8. A plasma processing apparatus comprising:

an airtight process chamber;

a support mechanism for supporting a target substrate in said process chamber;

an exhaust for exhausting said process chamber and setting said process chamber in a vacuum state;

a supply for supplying a process gas into said process chamber;

a first electrode for forming an electric field in said process chamber, thereby to turn said process gas into plasma;

an RF power supply for supplying an RF power to said first electrode;

a mechanism for radiating a microwave into said plasma;

an extraction mechanism for extracting a reflection wave of said microwave reflected by said plasma or extracting a passing wave of said microwave passing through said plasma;

a wave detection mechanism for subjecting said reflection wave or said passing wave to envelope wave detection to generate a wave detection signal; and an examination mechanism for determining presence or absence of an occurrence of abnormal discharge, from changes in amplitude or phase of said wave detection signal.

9. An apparatus according to claim 8, wherein said examination mechanism comprises a comparator for comparing said wave detection signal with a reference voltage.

10. An apparatus according to claim 8, further comprising a control mechanism for lowering a power value of said RF power for a period of time, when said examination mechanism determines presence of abnormal discharge.

11. An apparatus according to claim 10, wherein said period of time is set such that said period is equal to or longer than a time period for which abnormal discharge is expected to be maintained and such that said plasma does not disappear.

12. An apparatus according to claim 10, wherein said control mechanism cuts off supply of said RF power for said period of time, when said examination mechanism determines presence of abnormal discharge.

13. A plasma processing method comprising the steps of:

placing a target substrate in an airtight process chamber;

supplying a process gas into said process chamber;

supplying an RF power to a first electrode, thereby to generate an electric field in said process chamber and turn said process gas into plasma;

matching impedance of said RF power with impedance of said plasma;

subjecting said target substrate placed in said process chamber to a process, using said plasma;

extracting a reflection wave of said RF power reflected by said first electrode;

subjecting said reflection wave to envelope wave detection thereby to generate a wave detection signal; and examining and determining presence or absence of an occurrence of abnormal discharge, from changes in amplitude of said wave detection signal.

14. A method according to claim 13, wherein said wave detection signal is compared with a reference voltage in said step of examining, thereby to determine presence or absence of an occurrence of abnormal discharge.

15. A method according to claim 13, further comprising a step of controlling and lowering a power value of said RF power for a period of time, when presence of an occurrence of abnormal discharge is determined in said step of examining.

16. A method according to claim 15, wherein said period of time is set such that said period is equal to or longer than a time period for which abnormal discharge is expected to be maintained and such that said plasma does not disappear.

17. A method according to claim 15, wherein supply of said RF power is cut off for said period of time in said step of controlling, when an occurrence of abnormal discharge is determined in said step of examining.

18. A method according to claim 15, wherein power values of said RF power are not controlled in said step of matching, regardless of presence or absence of an occurrence of abnormal discharge, by a time when impedance of said RF power is matched with impedance of said plasma by said matching mechanism at first.

19. A method according to claim 16, further comprising a step of monitoring the number of occurrences of abnormal discharge, which are determined in said step of examining.

20. A method according to claim 19, further comprising a step of selecting whether or not a treatment step of recovering a damage caused by abnormal discharge is performed on said target substrate, on the basis of the number of occurrences of abnormal discharge, which is obtained in said step of monitoring.

21. A plasma processing method comprising the steps of:
placing a target substrate in an airtight process chamber;
supplying a process gas into said process chamber;
supplying an RF power to a first electrode thereby to generate an electric field in said process chamber and turn said process gas into plasma;
subjecting said target substrate placed in said process chamber to a process, using said plasma;
radiating a microwave into said plasma;
extracting a reflection wave of said RF power reflected by said first electrode or extracting a passing wave of said microwave passing through said plasma;
subjecting said reflection wave or said passing wave to envelope wave detection thereby to generate a wave detection signal; and
examining and determining presence or absence of an occurrence of abnormal discharge, from changes in amplitude or phase of said wave detection signal.

22. A method according to claim 21, wherein said wave detection signal is compared with a reference voltage in said step of examining, thereby to determine presence or absence of an occurrence of abnormal discharge.

23. A method according to claim 21, further comprising a step of controlling and lowering a power value of said RF power for a period of time, when presence of an occurrence of abnormal discharge is determined in said step of examining.

24. A method according to claim 23, wherein said period of time is set such that said period is equal to or longer than a time period for which abnormal discharge is expected to be maintained and such that said plasma does not disappear.

25. A method according to claim 23, wherein supply of said RF power is cut off for said period of time in said step controlling, when an occurrence of abnormal discharge is determined in said step of examining.

* * * * *